United States Patent
Elian et al.

(10) Patent No.: US 9,201,123 B2
(45) Date of Patent: Dec. 1, 2015

(54) MAGNETIC SENSOR DEVICE AND A METHOD FOR FABRICATING THE SAME

(75) Inventors: Klaus Elian, Alteglofsheim (DE); Thomas Mueller, Lappersdorf (DE)

(73) Assignee: Infineon Technologies AG, Neubiberg (DE)

( * ) Notice: Subject to any disclaimer, the term of this patent is extended or adjusted under 35 U.S.C. 154(b) by 666 days.

(21) Appl. No.: 13/289,735

(22) Filed: Nov. 4, 2011

(65) Prior Publication Data

US 2013/0113475 A1    May 9, 2013

(51) Int. Cl.
*G01R 33/02* (2006.01)
*G01R 33/00* (2006.01)
*H01F 1/113* (2006.01)
*H01F 1/08* (2006.01)

(52) U.S. Cl.
CPC ............ *G01R 33/0047* (2013.01); *H01F 1/083* (2013.01); *H01F 1/113* (2013.01); *Y10T 29/49002* (2015.01); *Y10T 29/49227* (2015.01)

(58) Field of Classification Search
CPC .... G01R 33/02; G01R 33/06; G01R 33/0047; G01R 3/00
USPC ............... 324/244, 219, 260, 207.23, 207.24, 324/207.25, 173, 174, 207.2, 207.21
See application file for complete search history.

(56) References Cited

U.S. PATENT DOCUMENTS

| | | | |
|---|---|---|---|
| 4,743,786 A | 5/1988 | Ichikawa et al. | |
| 4,899,104 A * | 2/1990 | Maelzer et al. | 324/750.25 |
| 4,945,634 A | 8/1990 | Kumada | |
| 5,210,493 A | 5/1993 | Schroeder et al. | |
| 5,508,611 A * | 4/1996 | Schroeder et al. | 324/252 |
| 5,581,179 A * | 12/1996 | Engel et al. | 324/207.2 |
| 5,963,028 A * | 10/1999 | Engel et al. | 324/207.2 |
| 6,175,229 B1 * | 1/2001 | Becker et al. | 324/117 H |
| 6,505,513 B1 | 1/2003 | Linke et al. | |
| 6,933,716 B2 * | 8/2005 | Stettler et al. | 324/207.25 |
| 7,385,394 B2 * | 6/2008 | Auburger et al. | 324/252 |
| 8,357,566 B2 * | 1/2013 | Wang et al. | 438/112 |
| 2003/0183954 A1 * | 10/2003 | Wolf | 257/795 |
| 2004/0080046 A1 | 4/2004 | Choon Kuan et al. | |
| 2006/0038560 A1 | 2/2006 | Kurumado | |
| 2007/0018642 A1 * | 1/2007 | Ao | 324/252 |
| 2007/0075705 A1 * | 4/2007 | Kurumado | 324/207.25 |
| 2007/0120555 A1 * | 5/2007 | Tokuhara | 324/207.21 |
| 2007/0145972 A1 | 6/2007 | Auburger et al. | |
| 2007/0164734 A1 * | 7/2007 | Shimizu et al. | 324/207.25 |

(Continued)

FOREIGN PATENT DOCUMENTS

| | | |
|---|---|---|
| CN | 1737503 A | 2/2006 |
| CN | 101617243 A | 12/2009 |

(Continued)

OTHER PUBLICATIONS

Hung, Y.C., et al., "Effects of Additives on the Orientation and Strength of Plastic Ferrite Magnet," IEEE Transactions on Magnetics, Sep. 1989, pp. 3287-3289, vol. 25, No. 5.

*Primary Examiner* — Patrick Assouad
*Assistant Examiner* — Lamarr Brown
(74) *Attorney, Agent, or Firm* — Slater & Matsil, L.L.P.

(57) ABSTRACT

A magnetic sensor device includes a plurality of electrical wires, a magnetic sensor chip, and a magnet. The magnet is formed from a material composition of a polymer and magnetic particles and attached to at least one of the electrical wires.

15 Claims, 10 Drawing Sheets

(56) References Cited

U.S. PATENT DOCUMENTS

| | | |
|---|---|---|
| 2007/0188277 A1 | 8/2007 | Ries |
| 2007/0205094 A1* | 9/2007 | Pavan et al. ............... 204/192.1 |
| 2007/0241423 A1 | 10/2007 | Taylor et al. |
| 2007/0247144 A1* | 10/2007 | Tokuhara et al. ........ 324/207.25 |
| 2008/0061768 A1* | 3/2008 | Kurumdo ................ 324/207.21 |
| 2009/0065912 A1 | 3/2009 | Riedl et al. |
| 2009/0096441 A1* | 4/2009 | Masuda ....................... 324/173 |
| 2009/0140724 A1* | 6/2009 | Kentsch ....................... 324/202 |
| 2009/0140725 A1 | 6/2009 | Ausserlechner |
| 2009/0243595 A1 | 10/2009 | Theuss et al. |
| 2010/0117171 A1 | 5/2010 | Hesen et al. |
| 2010/0201356 A1* | 8/2010 | Koller et al. ................. 324/252 |
| 2010/0330708 A1 | 12/2010 | Engel et al. |
| 2011/0127998 A1 | 6/2011 | Elian et al. |
| 2011/0133732 A1 | 6/2011 | Sauber |
| 2011/0209894 A1 | 9/2011 | Williams et al. |
| 2012/0038352 A1 | 2/2012 | Elian et al. |
| 2012/0086444 A1 | 4/2012 | Chen et al. |
| 2013/0127027 A1* | 5/2013 | Wang et al. ................... 257/666 |

FOREIGN PATENT DOCUMENTS

| | | |
|---|---|---|
| CN | 101656242 A | 2/2010 |
| CN | 101681894 A | 3/2010 |
| DE | 102008058895 A1 | 6/2009 |
| DE | 102009013510 A1 | 10/2009 |
| JP | 979865 A | 3/1997 |
| JP | 9166612 A | 6/1997 |

* cited by examiner

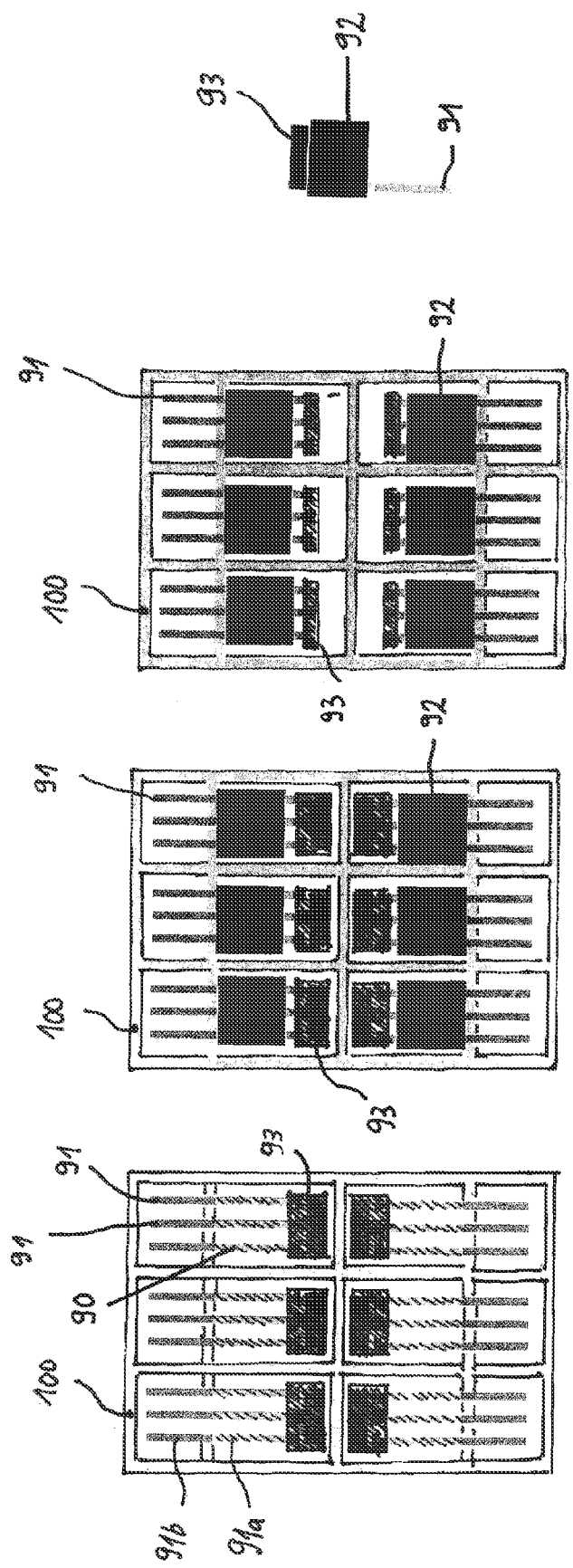

MAGNETIC SENSOR DEVICE AND A METHOD FOR FABRICATING THE SAME

TECHNICAL FIELD

The present invention relates to a magnetic sensor device and a method for fabricating the same.

BACKGROUND

Magnetic sensor devices can detect the motion of magnetic metal pieces and they can, for example, be configured to measure the speed of a magnetic tooth wheel. Such magnetic speed sensors typically include an integrated circuit with a plurality of magnetic sensor elements, such as Hall sensor elements or Magneto Resistive Sensors (XMR sensors) as, for example, AMR (anisotrope magneto resistive) sensors or giant magneto resistive (GMR) sensors. A permanent magnet provides a bias magnetic field to the sensor elements. As the wheel is rotated, the teeth of the wheel pass in front of the sensor and generate a small field variation, which is detected by the sensor and processed by the integrated circuit. The detected field contains information about the angular position and rotational speed of the wheel. With respect to the fabrication of such magnetic sensor devices there is a steady demand towards reducing or simplifying fabrication steps, in particular reducing pick-and-place steps or mold steps. Another steady demand relates to the size of the magnetic sensor device package and to the variability of the shape of the permanent magnet as it can be desirable to provide the permanent magnet with a specific shape so as to provide the permanent magnetic field with a particular desired field distribution.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 9A-9D show schematic top view and side view representations for illustrating a method for fabricating a magnetic sensor device according to an embodiment.

DETAILED DESCRIPTION OF ILLUSTRATIVE EMBODIMENTS

Figure 1:
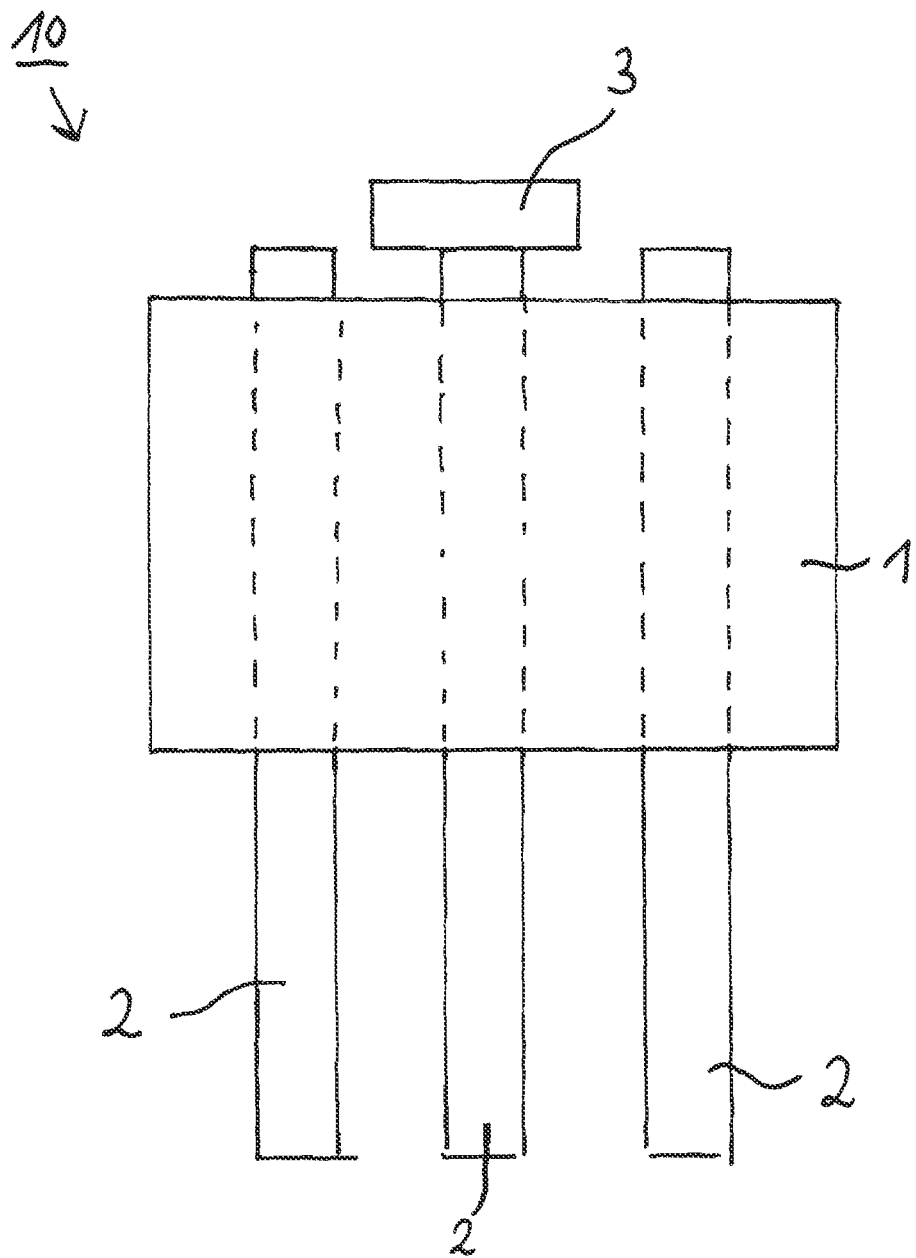
FIG. 1 shows a schematic cross-sectional side view representation of a magnetic sensor device according to an embodiment.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless of whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

In several embodiments layers or layer stacks are applied to one another or materials are applied or deposited onto layers or other substrates. It should be appreciated that any such terms as "applied" or "deposited" are meant to cover literally all kinds and techniques of applying layers or materials onto substrates. In particular, they are meant to cover techniques in which layers or materials are applied at once as a whole like, for example, laminating techniques as well as techniques in which layers or materials are deposited in a sequential manner like, for example, sputtering, plating, molding, CVD, etc.

Embodiments as described herein comprise magnetic sensor chips. The magnetic sensor chips may comprise contact elements or contact pads on one or more of their outer surfaces wherein the contact elements serve for electrically contacting the magnetic sensor chips. The contact elements may have any desired form or shape. They can, for example, have the form of lands, i.e., flat contact layers on an outer surface of the semiconductor package. The contact elements or contact pads may be made from any electrically conducting material, e.g., from a metal as aluminum, gold, or copper, for example, or a metal alloy, or an electrically conducting organic material, or an electrically conducting semiconductor material.

In the claims and in the following description different embodiments of a method for fabricating a magnetic sensor device are described as a particular sequence of processes or measures, in particular in the flow diagrams. It is to be noted that the embodiments should not be limited to the particular sequence described. Particular ones or all of the different processes or measures can also be conducted simultaneously or in any other useful and appropriate sequence.

In the following several embodiments are presented in which a magnetic sensor chip is used and intended for sensing a static or dynamic magnetic field. It is to be noted that the magnetic sensor chip can be constructed in different ways and can work along different measurement principles. The magnetic sensor chip can, for example, comprise a Hall sensor element. Alternatively, the magnetic sensor chip can comprise a magneto resistive (XMR) element. Also other implementations of a magnetic sensor chip can be employed by the skilled person.

Referring to FIG. 1, there is shown a schematic cross-sectional side view representation of a magnetic sensor device according to an embodiment. The magnetic sensor device 10 comprises a plurality of electrical wires 2, a magnetic sensor chip 3, and a magnet 1, the magnet 1 being comprised of a material composition of a polymer and magnetic particles, the material composition being attached to at least one of the electrical wires 2, in particular to all of the electrical wires 2 as shown in the embodiment of FIG. 1. According to an embodiment, the material composition can be configured such that magnetic particles are coated with a polymer or polymer-based material, in particular with a thermoset polymer material and in particular such that the filling degree of magnetic particles is >>90%. According to an embodiment the material composition can be configured such that a polymer or polymer-based material, in particular a thermoplast material, is filled with magnetic particles, in particular such that the filling degree of magnetic particles is <90%, in particular 80-90%.

According to an embodiment of the magnetic sensor device 10, the material composition is attached to the at least one of the electrical wires 2 in such a way that the at least one of the electrical wires extends through the material composition.

According to an embodiment of the magnetic sensor device 10, the material composition is attached to the at least one of the electrical wires 2 in such a way that the at least one of the electrical wires 2 is completely embedded within the material composition along a line section of the at least one electrical wire 2.

According to an embodiment of the magnetic sensor device 10, the material composition is attached to the electrical wires 2, in particular all electrical wires 2 of the plurality of electrical wires 2 are completely embedded within the material composition along respective line sections of the electrical wires 2. In the embodiment of FIG. 1 it is shown that the three electrical wires are completely embedded within the material composition along parallel respective line sections of the electrical wires 2. Those line sections are indicated by dashed lines. It is also possible, however, that the electrical wires 2 are embedded within the material composition in a different manner, i.e., the line sections may have different lengths or extensions which may be caused by a special shape of the magnet 1. Embodiments thereof will be shown later.

According to an embodiment of the magnetic sensor device 10, those electrical wires 2, to which the material composition is attached, are covered by an electrically insulating layer along respective line sections thereof. According to an embodiment thereof, the insulating layer comprises one or more of zinc-oxide, chromium-oxide, or a dielectric material or a tape material or the oxidized surface of the wire metal itself. An embodiment thereof will be shown and explained later. The zinc-oxide or chromium-oxide can be galvanically deposited.

According to an embodiment of the magnetic sensor device 10, the magnetic sensor chip 3 is attached to one or more of the electrical wires 2, in particular to a center electrical wire 2. According to an embodiment thereof, it can be attached to an end face of one of the electrical wires 2. According to an embodiment thereof, the end face can be part of an end portion of the electrical wire which is formed by one or more of forging or bending.

According to an embodiment of the magnetic sensor device 10, the magnet 1 comprises a shape of a cube or cuboid.

According to an embodiment of the magnetic sensor device 10, the magnet 1 comprises a shape which deviates from the shape of a cube or cuboid insofar as in a surface adjacent to the magnetic sensor chip 3 a depression is formed. With such a depression it is possible to provide a particular desired field distribution of the magnetic field generated by the magnet 1. According to an embodiment thereof, the depression has a rectangular or a triangular cross-section. Respective embodiments will be shown later.

According to an embodiment of the magnetic sensor device 10, the electrical wires 2 are fabricated out of a leadframe, in particular of a copper based leadframe. In particular, as will be shown and explained later, at the beginning of a fabrication process the electrical wires 2 can be part of a contiguous major leadframe which contains a plurality of single leadframes with electrical wires 2 and which is singulated during the fabrication process into single leadframes each one comprising one magnetic sensor device.

According to an embodiment of the magnetic sensor device 10, the magnetic sensor chip 3 comprises a Hall sensor element or a magneto resistive (XMR) sensor element.

According to an embodiment of the magnetic sensor device 10, the material composition of the magnet 1 comprises or consists of an epoxy resin or any other material which can be formed by molding or casting into any desired shape.

According to an embodiment of the magnetic sensor device 10, the device further comprises one or more capacitors each one connected between two electrical wires 2, respectively, or between a terminal of the magnetic sensor chip 3 and one electrical wire 2, respectively. In particular, the capacitors are configured to provide an adequate protection against electrostatic discharge (ESD). In particular, according to an embodiment, the capacitors each comprise capacitance values within a range from 0.5 nF to 100 nF, more specifically 1 nF to 50 nF. Embodiments of a magnetic sensor device comprising such capacitors will be shown and explained later.

According to an embodiment, the magnetic sensor chip 3 can be comprised of a silicon chip or silicon die. However, the magnetic sensor chip 3 can also be comprised of a package as, for example, a PSSO package which encloses the silicon chip or silicon die.

Figure 2:
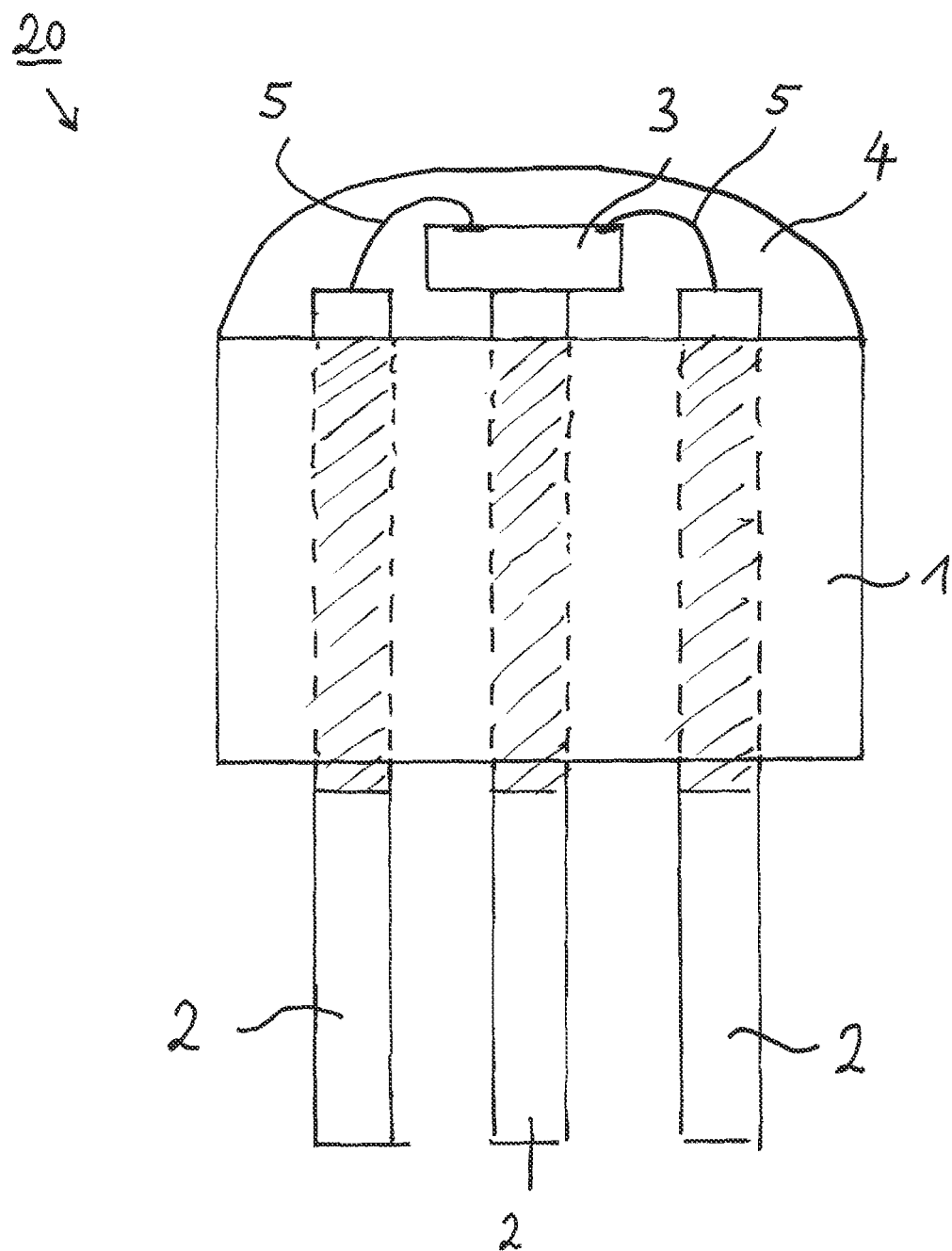
FIG. 2 shows a schematic cross-sectional side view representation of a magnetic sensor device according to an embodiment.

Referring to FIG. 2, there is shown a schematic cross-sectional side view representation of a magnetic sensor device according to an embodiment. The magnetic sensor device 20 comprises a structure which is similar to the magnetic sensor device 10 of FIG. 1. Insofar as the same reference signs as were used in FIG. 1 for the several structural elements are also used in FIG. 2, the description thereof will not be repeated here. In the following only those structural elements of the magnetic sensor device 20 are described which were added to the embodiment of a magnetic sensor device as shown in FIG. 1.

The magnetic sensor device 20 of FIG. 2 further comprises an encapsulation material 4 which encapsulates the magnetic sensor chip 3 and covers end faces of electrical wires 2 other than the center electrical wire 2 and an upper surface of the magnet 1. According to an embodiment, the encapsulation material 4 comprises or consists of one or more of a resin material, in particular an epoxy resin material, any sort of a material composition, or any sort of an UV curable material. According to an embodiment, the encapsulation material 4 can, for example, be applied by dip-coating. According to an embodiment, the encapsulation material 4 is applied only to an upper surface of the magnet 1 thereby embedding the magnetic sensor chip 3 and covering the end faces of the electrical wires 2 other than the center electrical wire 2 as shown in the embodiment of FIG. 2. However, it is also possible that the encapsulation material 4 also completely encapsulates the magnet 1 according to an embodiment which will be shown and explained later.

According to an embodiment of the magnetic sensor device 20 as shown in FIG. 2, the magnetic sensor chip 3 is attached to the center electrical wire 2 and also electrically connected to one or more of the other electrical wires 2 by bond wires 5. The bond wires 5 are also embedded within the encapsulation material 4. This is an embodiment in which the magnetic sensor chip 3 is itself comprised of a silicon chip. If, however, the magnetic sensor chip 3 is comprised of a package, the package may comprise external electrical contact areas and the package may be situated on all three electrical wires 2 thereby making electrical contact between the electrical wires 2 and the electrical contact areas of the package.

According to an embodiment of the magnetic sensor device 20 as shown in FIG. 2, the electrical wires 2 are coated or covered by an electrically insulating material along respective line sections (shown as hatched areas) within the magnet 1 in order to prevent an electrical short-circuit due to a possible electrical conductivity of the magnetic particles embedded within the polymer-based magnet 1. The electrically insulating material can, for example, comprise one or more of zinc-oxide or chromium-oxide which can be galvanically deposited onto the surfaces of the electrical wires 2 along the mentioned line sections. According to another embodiment, the electrically insulating material can be comprised of any electrically insulating polymer-based material like any sort of resin, in particular, epoxy resin, or any sort of dielectric insulating material. According to another embodiment, the electrically insulating material can be provided by an electrically insulating tape material which is wound around the electrical wires 2 along the mentioned line sections within the magnet 1. According to another embodiment, the electrically insulating material can be provided by an oxidized surface of the electrical wires.

Further embodiments of the magnetic sensor device 20 of FIG. 2 can be formed together with any one of the features and embodiments as described above in connection with the magnetic sensor device 10 of FIG. 1.

Figure 3A:
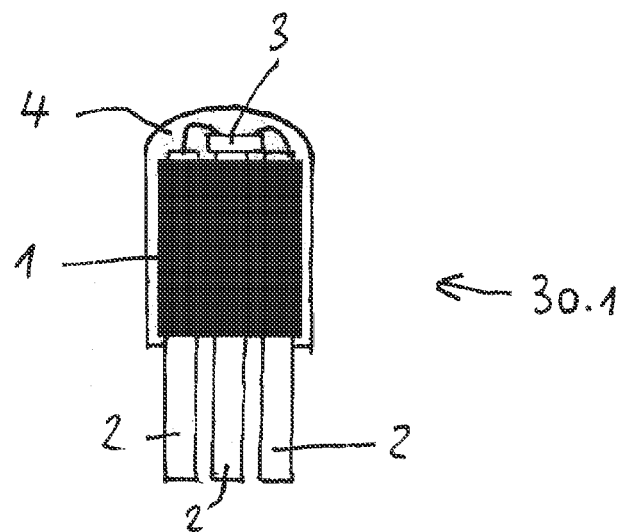
FIGS. 3A-3C show schematic cross-sectional side view representations of magnetic sensor devices according to embodiments.
Figure 3B:
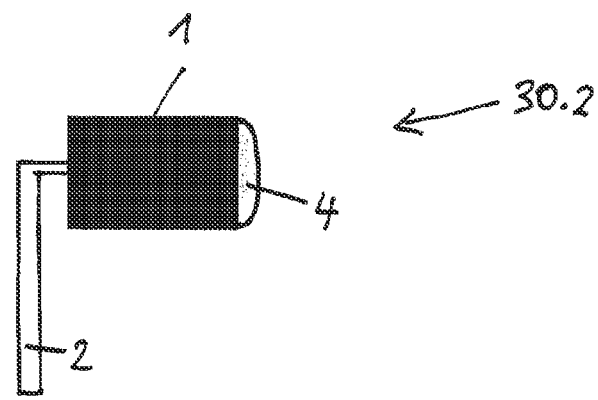
Figure 3C:
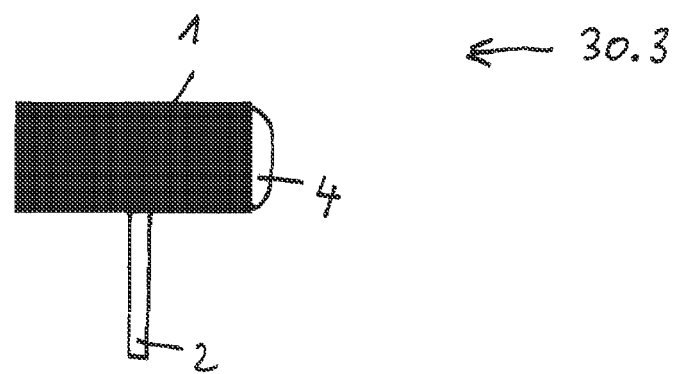

Referring to FIGS. 3A-3C, there are shown schematic cross-sectional side view representations of further embodiments of magnetic sensor devices. Again only additions and alterations as compared to the magnetic sensor devices shown in FIGS. 1 and 2, will be outlined in the following. FIG. 3A shows a magnetic sensor device 30.1 in which, as compared with the magnetic sensor device 20 of FIG. 2, the encapsulation material 4 is disposed in such a way that the whole magnet 1 together with the magnetic sensor chip 3 and the upper end faces of the electrical wires 2 are embedded within the encapsulation material 4. FIG. 3B shows a magnetic sensor device 30.2 having electrical wires 2 bent in a right corner at a position just before they penetrate into the magnet 1. The electrical wires 2 are shown in a side view on a row of the electrical wires 2 so that only one of the electrical wires 2 is to be seen. FIG. 3C shows a magnetic sensor device 30.3 in which the electrical wires 2 penetrate the magnet 1 from a side wall so that the electrical wires 2 are bent inside the magnet 1 in a right angle towards the magnetic sensor chip 3 and the encapsulation material 4.

Figure 4A:
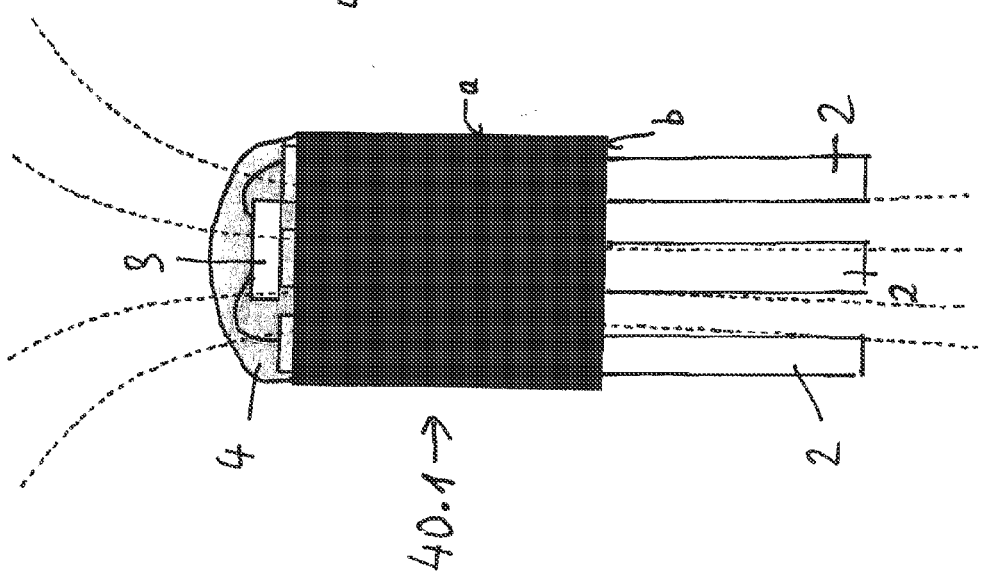
FIGS. 4A-4C show schematic cross-sectional side view representations of magnetic sensor devices according to embodiments.
Figure 4B:
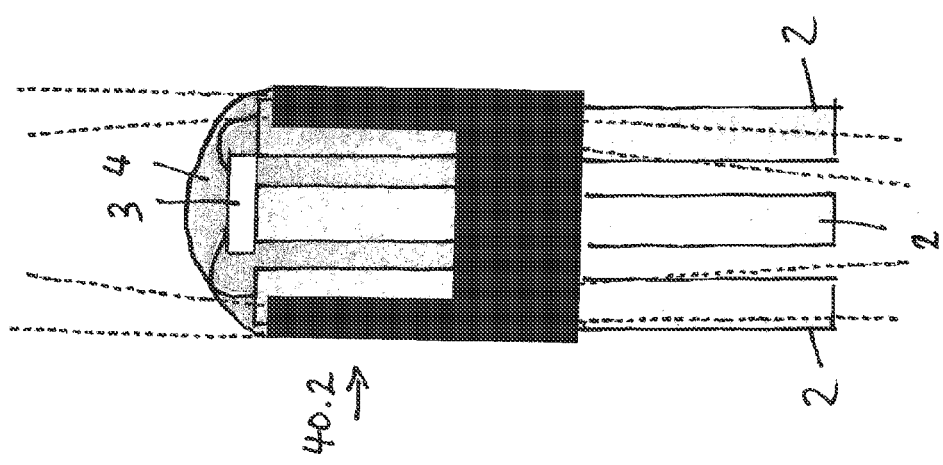
Figure 4C:
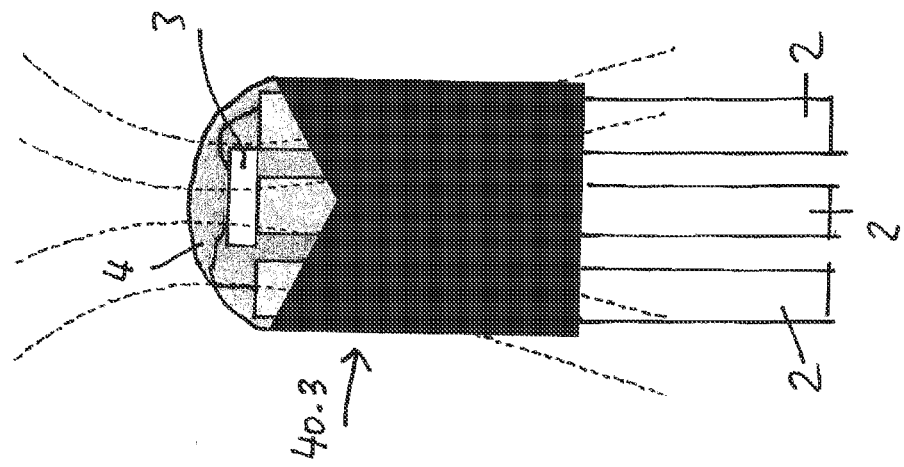

FIGS. 4A-4C show schematic cross-sectional side view representations of further embodiments of magnetic sensor devices. These further embodiments are intended to illustrate the various possibilities of shaping the permanent magnetic field generated by the magnet 1. FIG. 4A shows a magnetic sensor device 40.1 formed in the same way as the magnetic sensor device 20 of FIG. 2. In addition the dotted lines show the field lines of the magnetic field generated by the magnet 1. The magnet 1 has the shape of a cuboid having a rectangular cross-section with side faces a and b and a height c which is perpendicular to the plane of the sheet. FIG. 4B shows a magnetic sensor device 40.2 in which the magnet 1 is in principle formed in the same manner as in FIG. 4A but wherein a depression having a rectangular cross-section is formed from the upper surface into the magnet 1 so that in this region only side walls of the magnet 1 remain. It can be seen that the field lines of the magnetic field are significantly different as compared with FIG. 4A, in particular the field lines diverge in case of FIG. 4A and are more or less convergent in case of FIG. 4B. FIG. 4C shows a magnetic sensor device 40.3 in which the magnet 1 is also formed in principle in the same way as in FIG. 4A but wherein a depression is formed from the upper surface into the magnet 1, the depression having a triangular cross-section. Again it can be seen that the field lines of the magnetic field are different from those of the embodiments of FIGS. 4A and 4B.

Figure 5C:
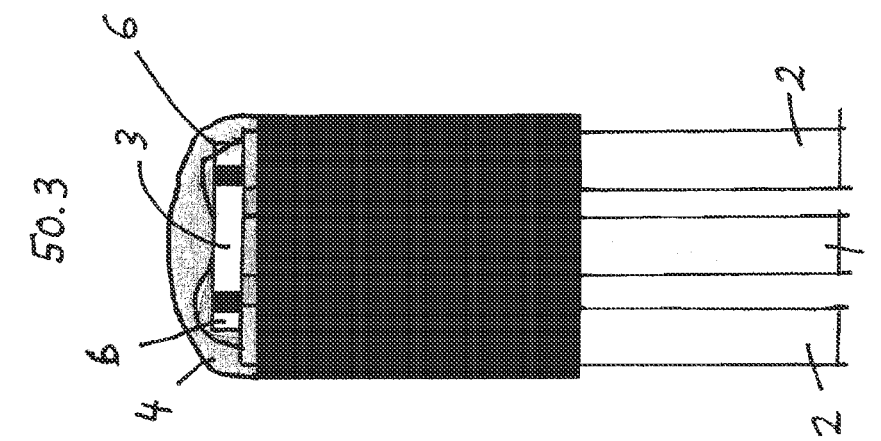
FIGS. 5A-5C show schematic cross-sectional side view representations of magnetic sensor devices according to embodiments.
Figure 5B:
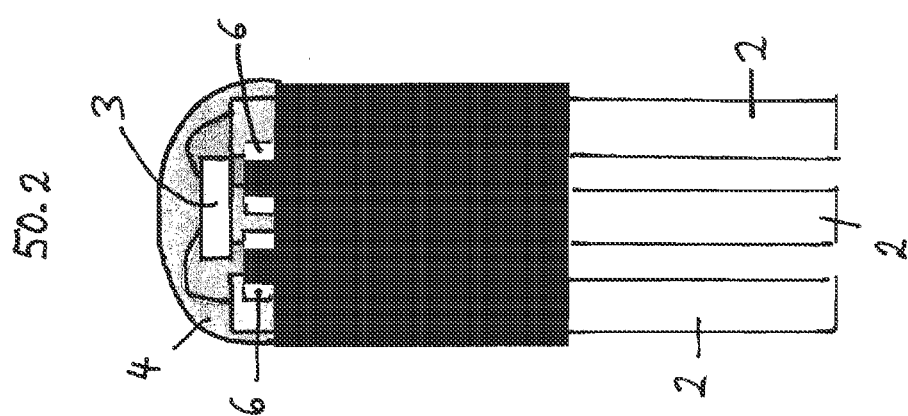
Figure 5A:
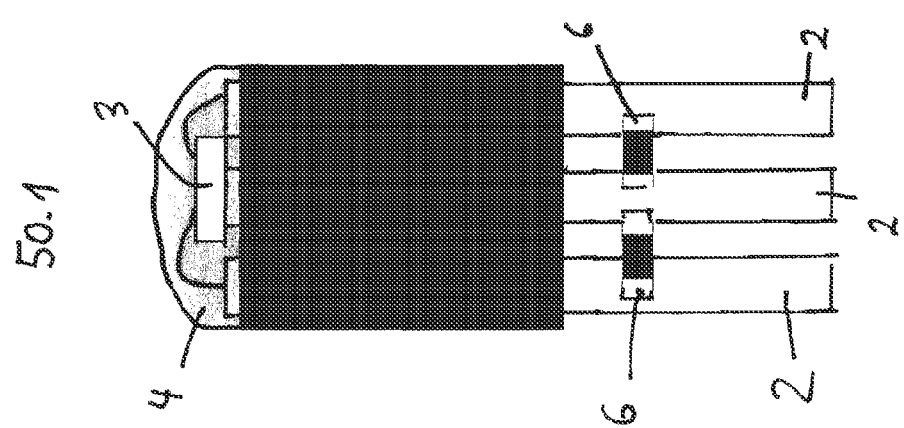

Referring to FIGS. 5A-5C there are shown schematic cross-sectional side view representations of further embodiments of magnetic sensor devices. These further embodiments are intended to show how electro-static discharge (ESD) can be efficiently prevented within a magnetic sensor device. Again only additions and alterations, as compared with the magnetic sensor device 20 in FIG. 2, are explained in the following. FIG. 5A shows a magnetic sensor device 50.1 comprising two capacitors 6, each one connected between two electrical wires 2. The capacitors 6 can, for example, be comprised of ceramic capacitors such as those of type X8R known by the skilled person. These sorts of capacitors are typically constructed as SMD (Surface Mounted Device) devices which can, for example, be mounted to the electrical wires 2 by means of an electrically conductive adhesive. The capacitance values of the capacitors 6 are typically in a range from 0.5 nF and 100 nF, more specifically 1 nF-50 nF. As shown in FIG. 5A, one of the two capacitors 6 is connected between the center electrical wire 2 and the left-sided electrical wire 2 and the second one of the capacitors 6 is connected between the center electrical wire 2 and the right-sided electrical wire 2. The capacitors 6 are connected to the electrical wires 2 at a position so that the magnet 1 is situated between the magnetic sensor chip 3 and the capacitors 6. FIG. 5B shows a magnetic sensor device 50.2 which is similar to the embodiment of FIG. 5A but wherein, however, the capacitors 6 are connected to the electrical wires 2 so that they are situated between the magnet 1 and the magnetic sensor chip 3.

The capacitors 6 are thus also covered by the encapsulation material 4. FIG. 5C shows a magnetic sensor device 50.3 in which the capacitors 6 are each one connected between an electrical terminal of the magnetic sensor chip 3 and one of the left-sided or right-sided electrical wires 2. Each one of the capacitors 6 is also attached on an upper surface of one of the left-sided or right-sided electrical wires 2.

Figure 6:
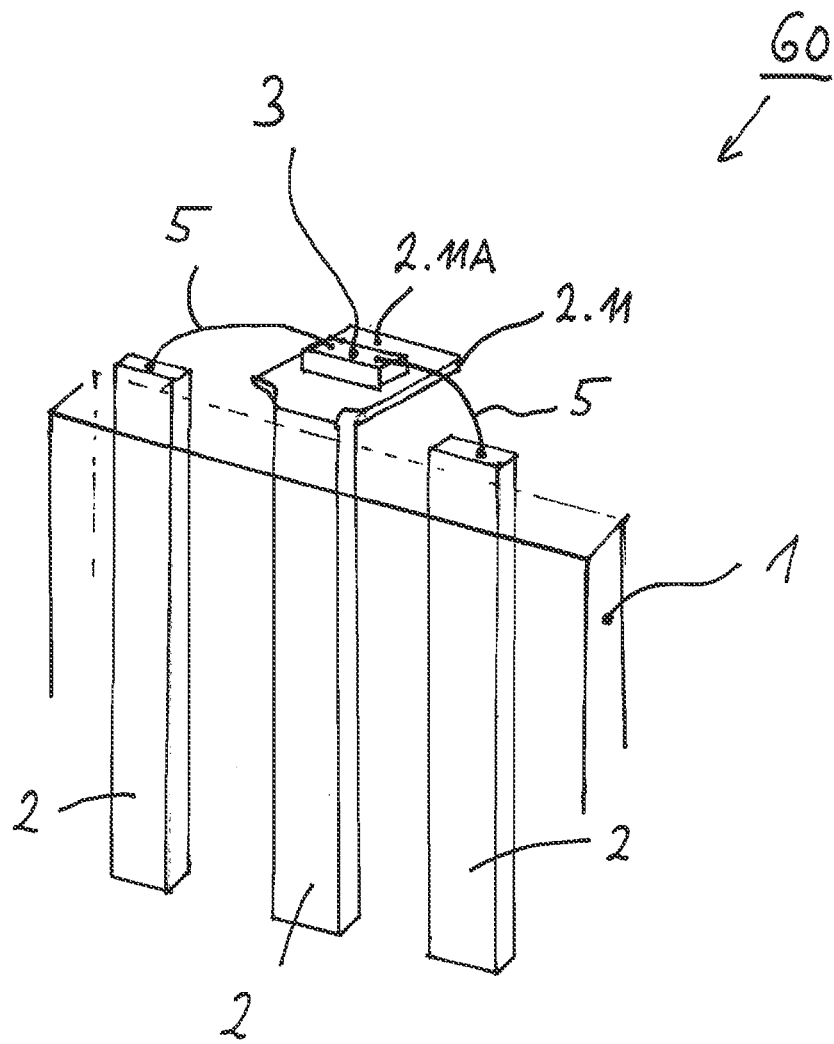
FIG. 6 shows a schematic perspective representation of a magnetic sensor device according to an embodiment.

Referring to FIG. 6, there is shown a perspective representation of a magnetic sensor device according to an embodiment. The magnetic sensor device 60 of FIG. 6 comprises three electrical wires 2. The center electrical wire 2 comprises an end portion 2.11 which is formed by bending as will be shown later. The end portion 2.11 comprises an upper flat surface 2.11A on which a magnetic sensor chip 3 is mounted. The upper surface 2.11A of the end portion 2.11 comprises a surface area which is sufficiently large so that the magnetic sensor chip 3 can be safely placed there upon, which means that in practice the surface area of the surface 2.11A is slightly larger than the lower surface of the magnetic sensor chip 3. The magnetic sensor chip 3 comprises at its upper surface electrical contact pads each of which is connected by means of a bond wire 5 with one of the other electrical wires 2.

Figure 7:
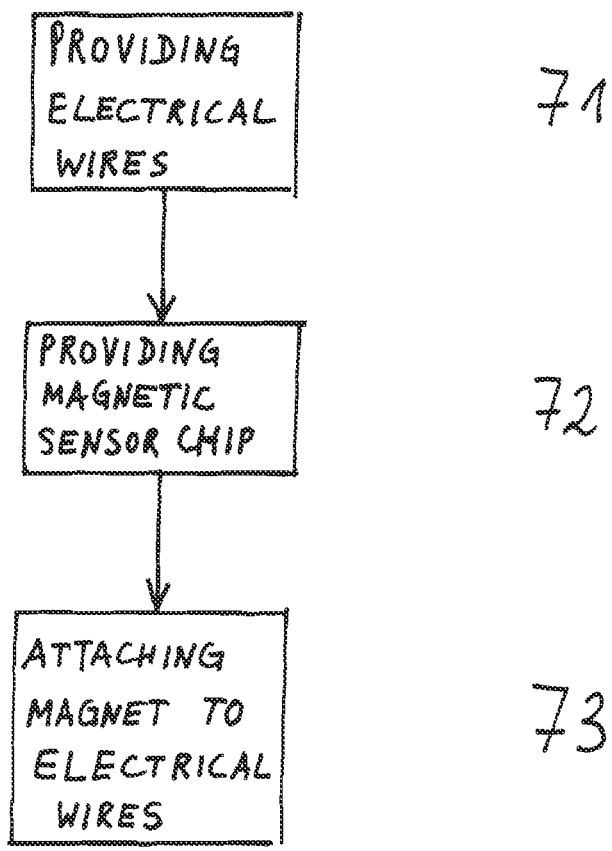
FIG. 7 shows a flow diagram for illustrating a method for fabricating a magnetic sensor device according to an embodiment.

Referring to FIG. 7, there is shown a flow diagram for illustrating a method for fabricating a magnetic sensor device according to an embodiment. The method 70 of FIG. 7 comprises providing a plurality of the electrical wires (71), providing a magnetic sensor chip (72), and attaching a magnet to at least one of the electrical wires, the magnet comprising a material composition of a polymer and magnetic particles (73).

According to an embodiment of the method 70, the method further comprises molding a material composition of a polymer and magnetic or magnetizable particles to the at least one of the electrical wires, in particular molding it on or around the at least one of the electrical wires or more than one or all of the electrical wires. In particular, along a pre-determined line section of the parallel electrical wires, the material composition is molded in such a way to the electrical wires that the electrical wires are completely embedded within the material composition along the pre-determined line sections of the wires. Thereafter, in a step of magnetization, the magnetizable particles of the material composition can be magnetized by means known in the art.

According to an embodiment of the method 70, the method further comprises covering those of the electrical wires to which the material composition is to be attached, with an electrically insulating layer along respective line sections thereof. The covering with an electrically insulating layer can, for example, be performed by galvanically depositing a zinc-oxide or a chromium-oxide layer onto the respective line sections of the electrical wires or oxidizing the respective line sections.

According to an embodiment of the method 70, the method further comprises providing the magnet with a shape of a cube or cuboid or with a shape deviating from a shape of a cube or cuboid insofar as in a surface adjacent to the magnetic sensor chip a depression is formed. According to an embodiment thereof, the depression may comprise a rectangular or a triangular cross-section.

According to an embodiment of the method 70, the magnetic sensor chip is attached to an end face of at least one of the electrical wires.

According to an embodiment of the method 70, the method further comprises encapsulating the magnetic sensor chip with an encapsulation material. According to an embodiment thereof, encapsulating with an encapsulation material can be performed by dipping the arrangement containing the magnetic sensor chip into a bath containing the encapsulation material in a liquid form. According to an embodiment, the encapsulation material can be made of an UV curable material so that in a following step the encapsulation material is exposed to UV radiation in order to be cured.

According to an embodiment of the method 70 of FIG. 7, the plurality of electrical wires is provided in the form of a leadframe.

Further embodiments of the method 70 of FIG. 7 can be formed with any one of the features or embodiments as were described above in connection with the embodiments of FIGS. 1 to 6.

Figure 8:
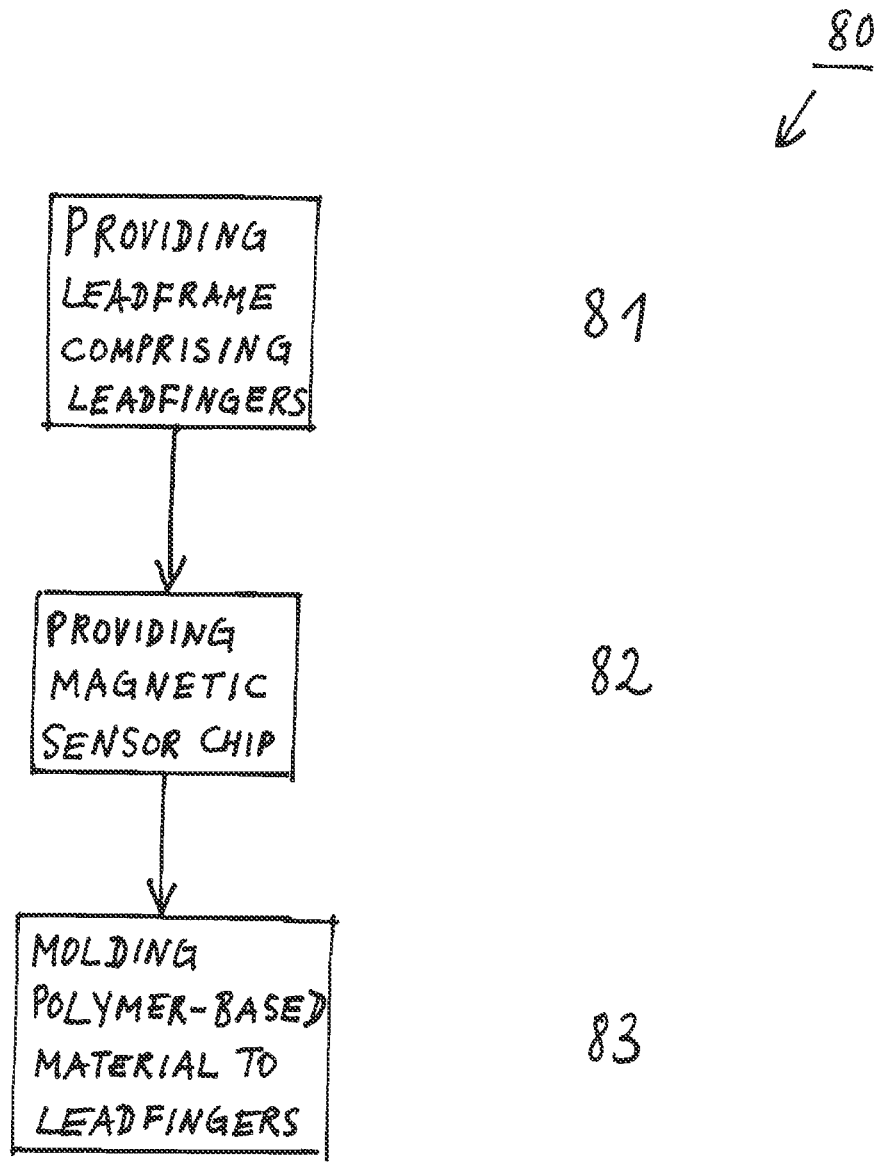
FIG. 8 shows a flow diagram for illustrating a method for fabricating a magnetic sensor device according to an embodiment.

Referring to FIG. 8, there is shown a flow diagram for illustrating a method for fabricating a magnetic sensor device according to an embodiment. The method 80 comprises providing a leadframe comprising a plurality of leadfingers (81), providing a magnetic sensor chip (82), and molding a material composition of a polymer and magnetic or magnetizable particles on or around at least one of the leadfingers (83).

According to an embodiment of the method 80, the method further comprises covering those of the leadfingers on or around which the material composition is to be molded, with an electrically insulating layer. According to an embodiment thereof, the covering with an electrically insulating layer is performed by depositing, in particular galvanically depositing, a zinc-oxide layer or a chromium-oxide layer or oxidizing the leadfingers.

According to an embodiment of the method 80, the method further comprises molding the material composition to a shape of a cube or cuboid or to a shape deviating from a shape of a cube or cuboid insofar as in a surface adjacent to the magnetic sensor chip a depression is formed. According to an embodiment thereof, the depression may comprise a rectangular or a triangular cross-section.

According to an embodiment of the method 80, the magnetic sensor chip is attached to an end face of at least one of the leadfingers.

Further embodiments of the method of FIG. 8 can be formed with any feature or embodiment as described above in connection with FIG. 7.

Referring to FIGS. 9A-9D, there are shown schematic top view and side view representations for illustrating a method for fabricating a magnetic sensor device. FIG. 9A shows a top view representation of a major leadframe 100 which is subdivided into six sections each containing a single leadframe 90 intended to become one magnetic sensor device. The single leadframes 90 are formed identical and comprise electrical wires 91. On respective end portions of the electrical wires 91a magnetic sensor chip 93 is attached. The magnetic sensor chip 93 can be in the form of a completely processed and packaged magnetic sensor chip. In particular, the magnetic sensor chip 93 can have the form of a PSSO packaged device. The single leadframes 90 are mounted within the major leadframe 100 in such a way that the electrical wires 91 are each divided into two parts, wherein one part, which is designated with the reference number 91a (hatched), is provided with an insulation layer and the other part, which is designated with reference number 91b, is left untreated. The insulation layer can be fabricated as described above, in particular by galvanically plating a zinc-oxide or a chromium-oxide layer.

FIG. 9B shows the same arrangement after compression molding of a material composition 92, in particular an epoxy coated magnet material, essentially onto the portions 91a of each one of the single leadframes 90. The material composition 92 comprises magnetizable particles embedded therein which are intended to be magnetized in a later step of the fabrication method. The compression molding can be performed by any standard process known by the skilled person.

Figure 10A:
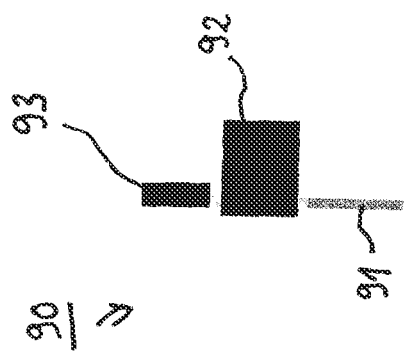
FIGS. 10A-10C show schematic cross-sectional side view representations of a method step for obtaining an intermediate product as shown in FIG. 10C according to an embodiment.
Figure 10B:
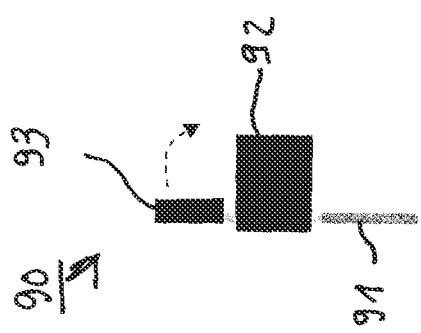
Figure 10C:
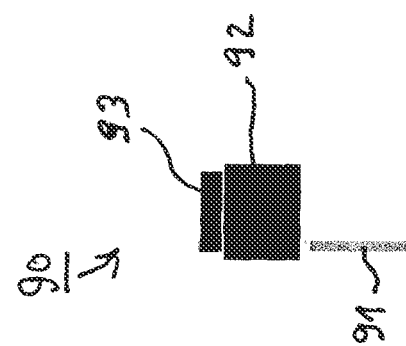

FIG. 9C shows a representation of the major leadframe 100 as shown in FIG. 9B after bending down the end portions of the single leadframes 90 together with the magnetic sensor chips 93 being carried by those end portions. Details of this process are shown in further detail in FIGS. 10A-10C. FIG. 10A shows a side view onto one row of single leadframes 90 of FIG. 9B. FIG. 10B shows the arrangement by additionally illustrating the direction of bending of the leadframe end portions by a broken curved arrow. FIG. 10C shows the arrangement after bending the leadframe end portions so that they come to rest on an upper surface of the magnet 92. Following the step as shown in FIG. 9C, the major leadframe 100 may be divided into two halves each containing three single leadframes 90 and each one of the halves are dipped into a resin bath in order to encapsulate the magnetic sensor chips 93 with an encapsulation material consisting of an epoxy resin. Thereafter, the encapsulation material is exposed to UV radiation in order to be cured.

Thereafter, an external magnetic field is applied in order to magnetize the magnetizable particles embedded in the material composition 92.

Thereafter, the arrangement is singulated into single magnetic sensor devices one of which is shown in FIG. 9D.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A magnetic sensor device comprising:
   a magnetic sensor chip;
   a plurality of electrical wires; and
   a permanent magnet configured to generate a bias magnetic field, the permanent magnet being arranged so that at least one of the electrical wires of the plurality of electrical wires extends through opposing parallel side faces of the permanent magnet.

2. The magnetic sensor device according to claim 1, wherein the at least one of the electrical wires is completely embedded within a material composition along a line section of an electrical wire of the plurality of electrical wires.

3. The magnetic sensor device according to claim 2, wherein the at least one of the electrical wires, to which the material composition is attached, are covered by an electrically insulating layer along respective line sections thereof.

4. The magnetic sensor device according to claim 1, wherein the permanent magnet comprises a shape of a cube or cuboid.

5. A magnetic sensor device comprising:
   a leadframe comprising leadfingers;
   a magnetic sensor chip attached to at least one of the leadfingers;
   a magnet comprising a first material composition of a polymer and magnetic particles, the first material composition being attached to at least one of the leadfingers; and
   an encapsulant comprising a second material composition different from the first material composition, the encapsulant encapsulating the magnetic sensor chip.

6. The magnetic sensor device according to claim 5, wherein the first material composition is attached to the at least one of the leadfingers in such a way that the at least one of the leadfingers extends through the first material composition.

7. The magnetic sensor device according to claim 5, wherein the first material composition is attached to the at least one of the leadfingers in such a way that the at least one of the leadfingers is completely embedded within the first material composition along a line section of the leadfingers.

8. The magnetic sensor device according to claim 5, wherein the at least one of the leadfingers, to which the first material composition is attached, are covered by an electrically insulating layer along respective line sections thereof.

9. A method for fabricating a magnetic sensor device, the method comprising:
   providing a plurality of electrical wires;
   providing a magnetic sensor chip; and
   attaching a magnet to at least one of the electrical wires, the magnet comprising a material composition of a polymer and magnetic particles, wherein the at least one of the electrical wires extends through opposing parallel sides faces of the magnet.

10. The method according to claim 9, further comprising molding the material composition to the at least one of the electrical wires.

11. The method according to claim 9, further comprising covering the at least one of the electrical wires, to which the material composition is to be attached, with an electrically insulating layer along respective line sections thereof.

12. The method according to claim 9, wherein the magnet has a shape of a cube or cuboid or a shape deviating from a shape of a cube or cuboid insofar as in a surface adjacent to the magnetic sensor chip a depression is formed.

13. A method for fabricating a magnetic sensor device, the method comprising:
   providing a leadframe comprising a plurality of leadfingers;
   providing a magnetic sensor chip; and
   molding a material composition of a polymer and magnetic or magnetizable particles on or around at least one of the leadfingers, wherein the material composition molded on or around at least one of the leadfingers does not cover the magnetic sensor chip.

14. The method according to claim 13, further comprising covering those of the leadfingers on or around which the material composition is to be molded with an electrically insulating layer.

15. The method according to claim 13, further comprising molding the material composition to a shape of a cube or cuboid or to a shape deviating from a shape of a cube or cuboid insofar as in a surface adjacent to the magnetic sensor chip a depression is formed.

* * * * *